United States Patent
Ishida

(10) Patent No.: US 8,303,232 B2
(45) Date of Patent: Nov. 6, 2012

(54) SUBSTRATE PROCESSING SYSTEM

(75) Inventor: Seiki Ishida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 536 days.

(21) Appl. No.: 12/620,026

(22) Filed: Nov. 17, 2009

(65) Prior Publication Data
US 2010/0129182 A1 May 27, 2010

(30) Foreign Application Priority Data

Nov. 27, 2008 (JP) ................................. 2008-302701

(51) Int. Cl.
*B65H 5/00* (2006.01)
(52) U.S. Cl. .................................. 414/222.01; 414/939
(58) Field of Classification Search .................. 414/217, 414/331.01, 331.14, 331.18, 935, 937, 939, 414/411, 222.01, 222.09, 222.12, 222.05
See application file for complete search history.

(56) References Cited

U.S. PATENT DOCUMENTS

| | | | | |
|---|---|---|---|---|
| 5,564,889 A | * | 10/1996 | Araki | 414/806 |
| 7,337,792 B2 | * | 3/2008 | Kamikawa et al. | 134/148 |
| 2002/0187024 A1 | * | 12/2002 | Nulman | 414/217 |
| 2006/0245852 A1 | * | 11/2006 | Iwabuchi | 414/217 |
| 2007/0081881 A1 | * | 4/2007 | Okuno et al. | 414/217 |

FOREIGN PATENT DOCUMENTS

| | | | |
|---|---|---|---|
| JP | 2003-273058 A1 | 9/2003 | |
| KR | 10 2005 0104457 A1 | 11/2005 | |

* cited by examiner

*Primary Examiner* — Donald Underwood
(74) *Attorney, Agent, or Firm* — Burr & Brown

(57) ABSTRACT

There are disposed two second substrate transferring apparatuses 60*a* and 60*b*, which are configured to transfer substrates W between substrate processing units 40 and a substrate accommodating part 30, in the up and down direction so as to correspond to the respective groups to which the plurality of substrate processing units 40 are divided. In addition, there is disposed a substrate displacing apparatus 35 that is configured to displace a substrate W, which has been transferred by a first substrate transferring apparatus 50 to the substrate accommodating part 30 and is not yet processed by the wafer processing unit 40, to another position in the up and down direction in the substrate accommodating part 30, as well as displace a substrate W, which has been processed by the wafer processing unit 40*a* and transferred by the second substrate transferring apparatus 60*a* to the substrate accommodating part 30, to another position in the up and down direction in the substrate accommodating part 30.

9 Claims, 6 Drawing Sheets

SUBSTRATE PROCESSING SYSTEM

FIELD OF THE INVENTION

The present disclosure relates to a substrate processing system configured to perform a liquid process using a process liquid, a gas process using a process gas, or processes such as a cleaning process and a thermal process, to substrates such as semiconductor wafers. Particularly, the present disclosure relates to a substrate processing system capable of increasing the number of substrates to be processed per unit time.

BACKGROUND ART

There have been conventionally known various types of substrate processing systems configured to perform a liquid process using a process liquid, a gas process using a process gas, or processes such as a cleaning process and a thermal process, to substrates such as semiconductor wafers. Such a substrate processing system is equipped with a plurality of substrate processing units for processing substrates. In addition, the substrate processing system is provided with a substrate accommodating part for temporarily accommodating substrates which are not yet processed by the substrate processing units, and substrates which have been processed by the substrate processing units. With the use of a substrate transferring apparatus, the substrates which are not yet processed by the substrate processing units are transferred from the substrate accommodating part to the substrate processing units, and the substrates which have been processed by the substrate processing units are transferred from the substrate processing units to the substrate accommodating part.

To be specific, for example, JP2003-273058A discloses a substrate processing system including a plurality of (specifically four) substrate processing units for cleaning substrates such as semiconductor wafers. In the substrate processing system disclosed in JP2003-273058A, the substrate processing units are disposed in two tiers in an up and down direction. One substrate transferring apparatus alternately transfers substrates from a substrate accommodating part to the respective substrate processing units disposed in two tiers in the up and down direction, and alternately transfers substrates from the respective substrate processing units disposed in two tiers in the up and down direction to the substrate accommodating part.

DISCLOSURE OF THE INVENTION

However, in the substrate processing system disclosed in JP2003-273058A, when substrates are transferred between the respective substrate processing units disposed in the plurality of tiers and the substrate accommodating part by the one substrate transferring apparatus, there arises the following problem. Namely, the substrate transferring apparatus alternately transfers substrates from the substrate accommodating part to the respective substrate processing units and alternately transfers substrates from the respective substrate processing units to the substrate accommodating part. Thus, when a large number of substrates are processed by the substrate processing system, a processing ability of the substrate processing system is degraded because of a time required to transfer the substrates between the substrate accommodating part and the respective substrate processing units.

In order to solve such a problem, it can be considered that a plurality of substrate transferring apparatuses are disposed along the up and down direction so as to correspond to the respective substrate processing units that are disposed in a plurality of tiers in the up and down direction. However, even in this method, since the plurality of substrate transferring apparatuses cannot simultaneously access the substrate accommodating part, while one of the substrate transferring apparatuses transfers a substrate to the substrate accommodating part or takes out a substrate therefrom, another substrate transferring apparatus is uselessly obliged to wait. That is, when the plurality of substrate transferring apparatuses access the substrate accommodating part, there occurs a backup (or jam-up) of the substrate transferring apparatuses. Thus, there is a problem in that a plurality of substrates cannot be effectively transferred between the substrate accommodating part and the substrate processing units.

The present disclosure provides a substrate processing system capable of effectively transferring a plurality of substrates between a substrate accommodating part for accommodating substrates and respective substrate processing units that are disposed in a plurality of tiers in the up and down direction, to thereby increase the number of substrates to be processed per unit time.

A substrate processing system of the present disclosure is a substrate processing system comprising: a plurality of substrate processing units each of which is configured to process a substrate, the substrate processing units being divided into a plurality of groups that are disposed along an up and down direction; a substrate accommodating part configured to temporarily accommodate a plurality of substrates such that the substrates are separated from each other in the up and down direction; a first substrate transferring apparatus configured to transfer a substrate that is not yet processed by the substrate processing unit, to the substrate accommodating part, and to take out a substrate that has been processed by the substrate processing unit, from the substrate accommodating part; a plurality of second substrate transferring apparatuses disposed in tiers in the up and down direction so as to correspond to the respective groups in the up and down direction, each of the second substrate transferring apparatuses being configured to transfer a substrate between the substrate processing unit of the corresponding group and the substrate accommodating part; and a substrate displacing apparatus configured to displace a substrate, which has been transferred by the first substrate transferring apparatus to the substrate accommodating part and is not yet processed by the substrate processing unit, to another position in the up and down direction in the substrate accommodating part, as well as displace a substrate, which has been processed by the substrate processing unit and transferred by the second substrate transferring apparatus to the substrate accommodating part, to another position in the up and down direction in the substrate accommodating part.

In such a substrate processing system, the second substrate transferring apparatuses, which are configured to transfer substrates between the substrate processing units and the substrate accommodating part, are disposed in a plurality of tiers in the up and down direction so as to correspond to the respective groups into which the plurality of substrate processing units are divided. The substrate accommodating part is configured to temporarily accommodate a plurality of substrates such that the substrates are separated from each other in the up and down direction. The substrate displacing apparatus is configured to displace a substrate, which has been transferred by the first substrate transferring apparatus to the substrate accommodating part and is not yet processed by the substrate processing unit, to another position in the up and down direction in the substrate accommodating part, as well as displace a substrate, which has been processed by the substrate processing unit of the upper group and transferred by the second substrate transferring apparatus to the substrate accommodating part, to another position in the up and down direction in the substrate accommodating part. Thus, the substrates can be temporarily accommodated in the plurality of positions in the up and down direction of the substrate accommodating part. Further, the substrate accommodated in the substrate accommodating part can be displaced by the substrate displacing apparatus to another position in the up and down direction. Therefore, between the respective positions in the up and down direction of the substrate accommodating part in which the substrates are accommodated and the respective processing units, the transfer of the substrates by one of the second substrate transferring apparatuses corresponding to the substrate processing units of one group can be performed independently from the other second substrate transferring apparatus. Thus, the substrates can be effectively transferred between the substrate accommodating part and the respective substrate processing units. As a result, the substrate processing system can increase the number of substrates to be processed per unit time.

In the substrate processing system of the present disclosure, the substrate accommodating part may include: a first accommodating portion, a substrate being transferred to the first accommodating portion by the first substrate transferring apparatus, and a substrate being taken out from the first accommodating portion by the first substrate transferring apparatus; and a plurality of second accommodating portions disposed so as to correspond to the respective second substrate transferring apparatuses, a substrate being transferred to the second accommodating portion by the corresponding second substrate transferring apparatus, and a substrate being taken out from the second accommodating portion by the corresponding second substrate transferring apparatus; and that the substrate displacing apparatus may be configured to displace a substrate between the first accommodating portion and the second accommodating portions.

According to such a substrate processing system, the substrate, which has been transferred by the first substrate transferring apparatus to the first accommodating portion of the substrate accommodating part, is displaced by the substrate displacing apparatus to the second accommodating portion corresponding to the substrate processing unit in which the substrate is to be processed. Thereafter, the substrate is transferred by the second substrate transferring apparatus corresponding to the substrate processing unit in which the substrate is to be processed, from the second accommodating portion to the substrate processing unit. Meanwhile, the substrate, which has been processed by the substrate processing unit, is transferred by the second substrate transferring apparatus corresponding to the substrate processing unit, to the corresponding second accommodating portion of the substrate accommodating part. Then, the substrate is displaced by the substrate displacing apparatus from the second accommodating portion to the first accommodating portion. Finally, the substrate is taken out by the first substrate transferring apparatus from the first accommodating portion of the substrate accommodating part.

In the aforementioned substrate processing system, in the substrate accommodating part, the first accommodating portion may be arranged between the two second accommodating portions of the plurality of second accommodating portions.

In the substrate processing system of the present disclosure, the substrate accommodating part may include: a first accommodating portion, a substrate being transferred to the first accommodating portion by the one second substrate transferring apparatus of the plurality of second substrate transferring apparatuses, and a substrate being taken out from the first accommodating portion by the one second substrate transferring apparatus, while a substrate is transferred to the first accommodating portion by the first substrate transferring apparatus and a substrate is taken out from the first accommodating portion by the first substrate transferring apparatus; and one or more second accommodating portions disposed so as to correspond to the second substrate transferring apparatus(es) other than the one second transferring apparatus of the plurality of second substrate transferring apparatuses, a substrate being transferred to the second accommodating portion by the corresponding second substrate transferring apparatus, and a substrate being taken out from the second accommodating portion by the corresponding second substrate transferring apparatus; and the substrate displacing apparatus may be configured to displace a substrate between the first accommodating portion and the second accommodating portion(s).

According to such a substrate processing system, among the substrates which have been transferred by the first wafer transferring apparatus to the first accommodating portions of the substrate accommodating part, the substrate to be processed by the substrate processing unit corresponding to one of the second substrate transferring apparatuses is transferred by the one second substrate transferring apparatus from the first accommodating portion of the substrate accommodating part to the substrate processing unit. On the other hand, among the substrates which have been transferred by the first wafer transferring apparatus to the first accommodating portions of the substrate accommodating part, the substrate to be processed by the substrate processing unit corresponding to another second substrate transferring apparatus other than the one second substrate transferring apparatus is displaced by the substrate displacing apparatus to the second substrate accommodating portion corresponding to the substrate processing unit in which the substrate is to be processed. Meanwhile, the substrate, which has been processed by the substrate processing unit corresponding to the one second substrate transferring apparatus, is transferred by the corresponding second substrate transferring apparatus to the first accommodating portion of the substrate accommodating part. On the other hand, the substrate, which has been processed by the substrate processing unit corresponding to another second substrate transferring apparatus other than the one second substrate transferring apparatus, is transferred by the corresponding second substrate transferring apparatus to the second accommodating portion of the substrate accommodating part, and the substrate is displaced by the substrate displacing apparatus from the second accommodating portion to the first accommodating portion. Finally, the substrate is taken out by the first substrate transferring apparatus from the first accommodating portion of the substrate accommodating part.

In the substrate processing system of the present disclosure, the first substrate transferring apparatus may include, along the up and down direction, a plurality of forks each for holding a substrate; and that a plurality of substrates may be simultaneously transferred by the respective forks, when the substrates are transferred to the substrate accommodating part and when the substrates are taken out from the substrate accommodating part. Thus, the operation of the first substrate transferring apparatus for transferring the substrates to the substrate accommodating part and the operation of the first substrate transferring apparatus for taking out the substrates from the substrate accommodating part can be more effectively performed. As a result, the number of wafers to be processed per unit time can be increased.

In the substrate processing system of the present disclosure, in each of the groups, the plurality of substrate processing units may be disposed in a stacked situation along the up and down direction.

In the substrate processing system of the present disclosure, the first substrate transferring apparatus, the second transferring apparatuses, and the substrate displacing apparatus may be configured to respectively access the substrate accommodating part from different directions.

In the substrate processing system of the present disclosure, at least two of the first substrate transferring apparatus, the second transferring apparatuses, and the substrate displacing apparatus may be configured to simultaneously access the substrate accommodating part. Thus, there can be avoided a situation in which, while a certain apparatus accesses the substrate accommodating part, other apparatuses cannot access the substrate accommodating part and are obliged to wait. As a result, the substrate processing system can increase the number of substrates to be processed per unit time. Alternatively, in the substrate processing system of the present disclosure, the first substrate transferring apparatus, the second transferring apparatuses, and the substrate displacing apparatus may be configured to respectively access the substrate accommodating part from different directions, and at least two of the first substrate transferring apparatus, the second transferring apparatuses, and the substrate displacing apparatus may be configured to simultaneously access the substrate accommodating part.

EMBODIMENTS FOR CARRYING OUT THE INVENTION

Figure 1:
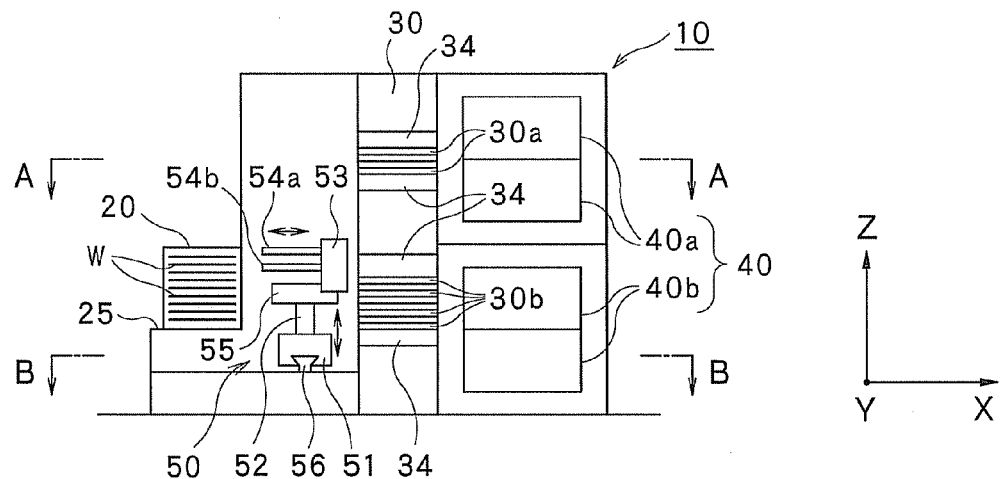
FIG. 1 is a schematic side view showing a structure of a wafer processing system in one embodiment of the present disclosure.
Figure 2:
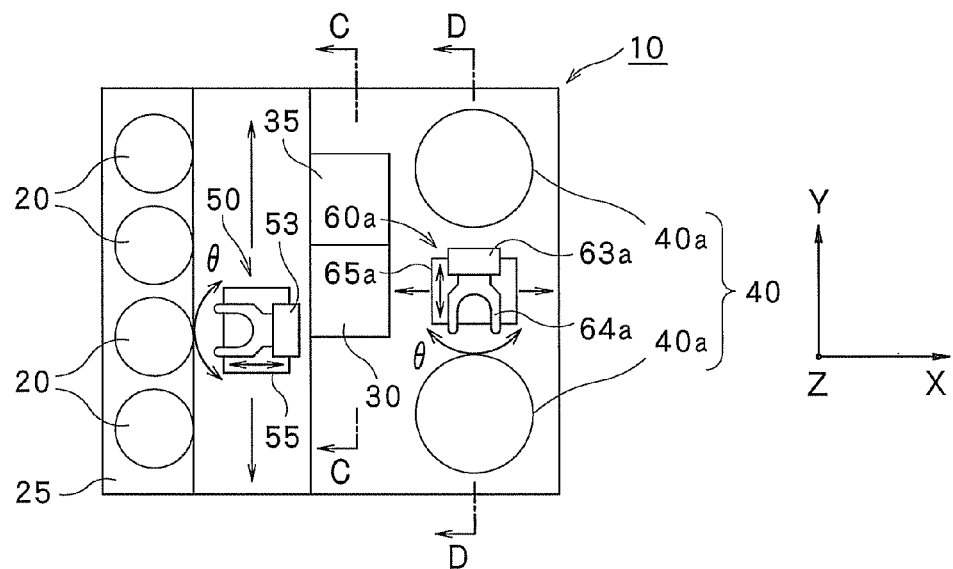
FIG. 2 is a top view of the wafer processing system shown in FIG. 1 taken along the arrows A-A.
Figure 3:
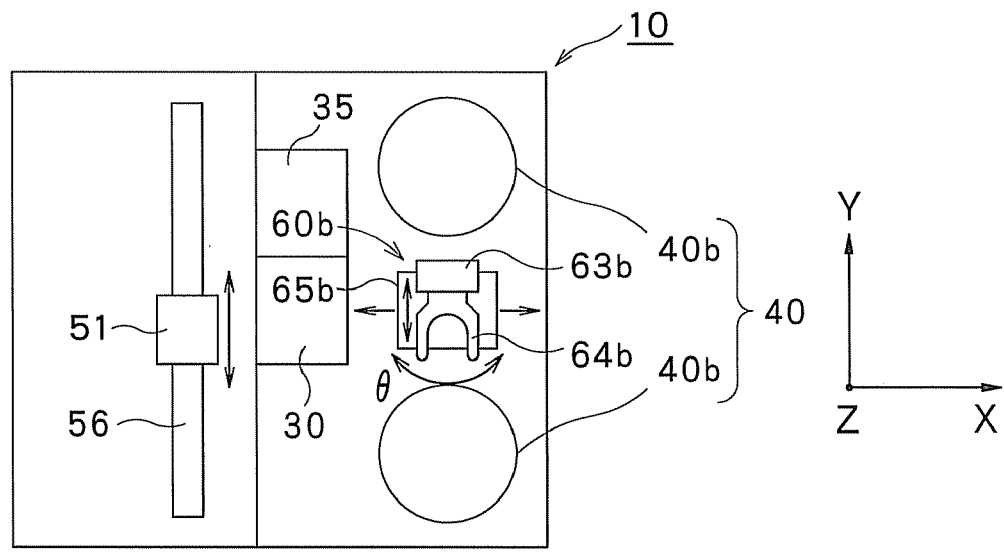
FIG. 3 is a top view of the wafer processing system shown in FIG. 1 taken along the arrows B-B.
Figure 4:
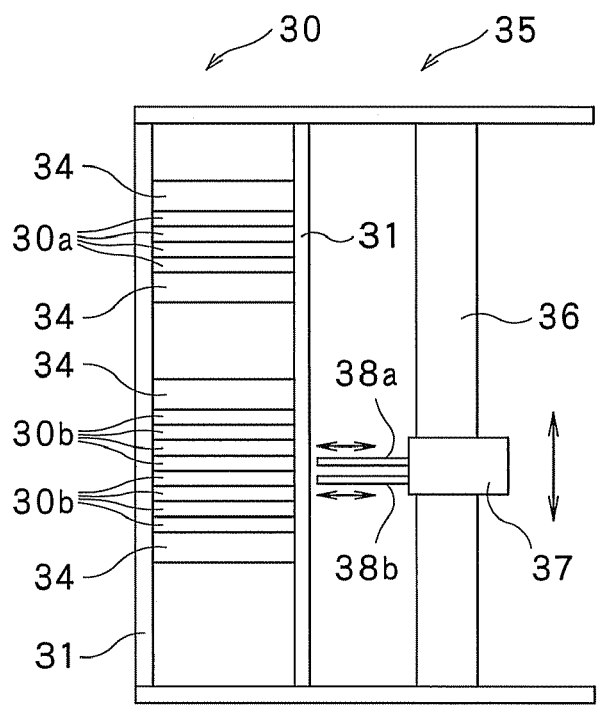
FIG. 4 is a side view of the wafer processing system shown in FIG. 2 taken along the arrows C-C.
Figure 5:
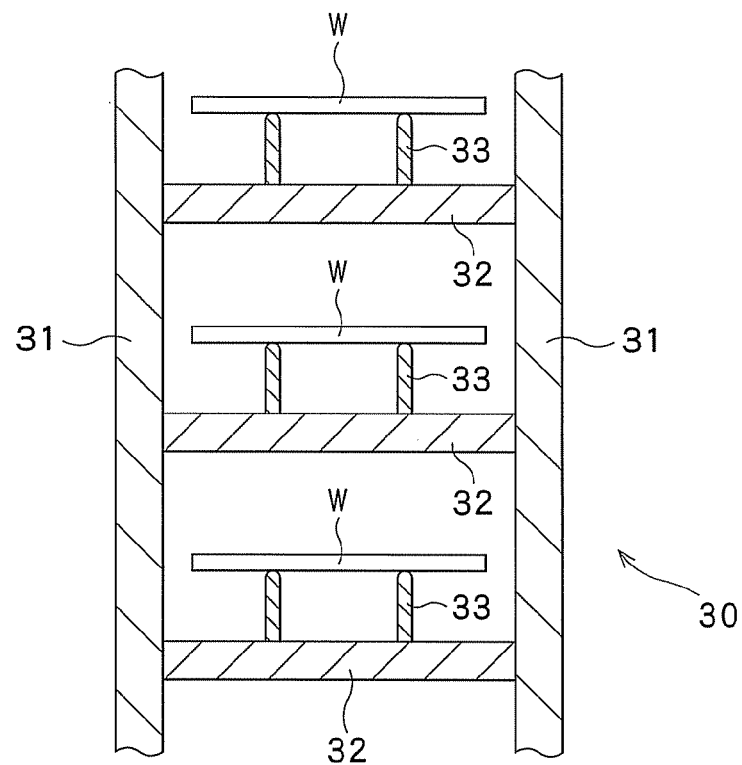
FIG. 5 is a lateral sectional view showing a concrete structure of respective accommodating portions of a wafer accommodating part shown in FIG. 4.
Figure 6:
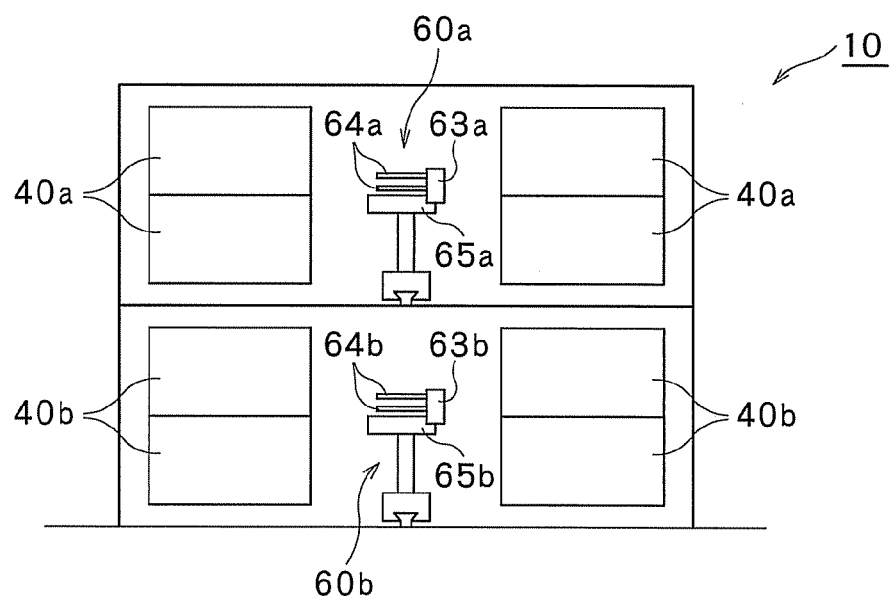
FIG. 6 is a side view of the wafer processing system shown in FIG. 2 taken along the arrows D-D.
Figure 7:
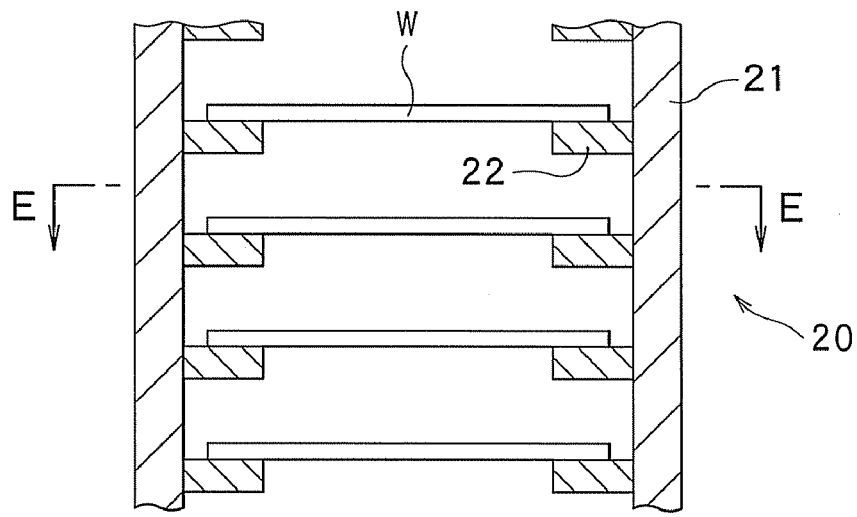
FIG. 7 is a lateral sectional view showing a structure of a FOUP accommodating wafers in the wafer processing system shown in FIG. 1.
Figure 8:
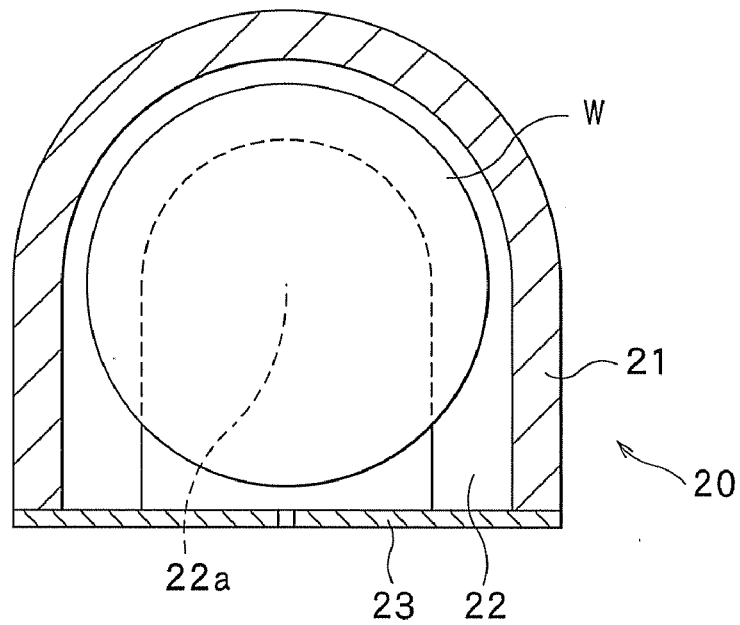
FIG. 8 is a sectional view of the FOUP shown in FIG. 7 taken along the arrows E-E.
Figure 9:
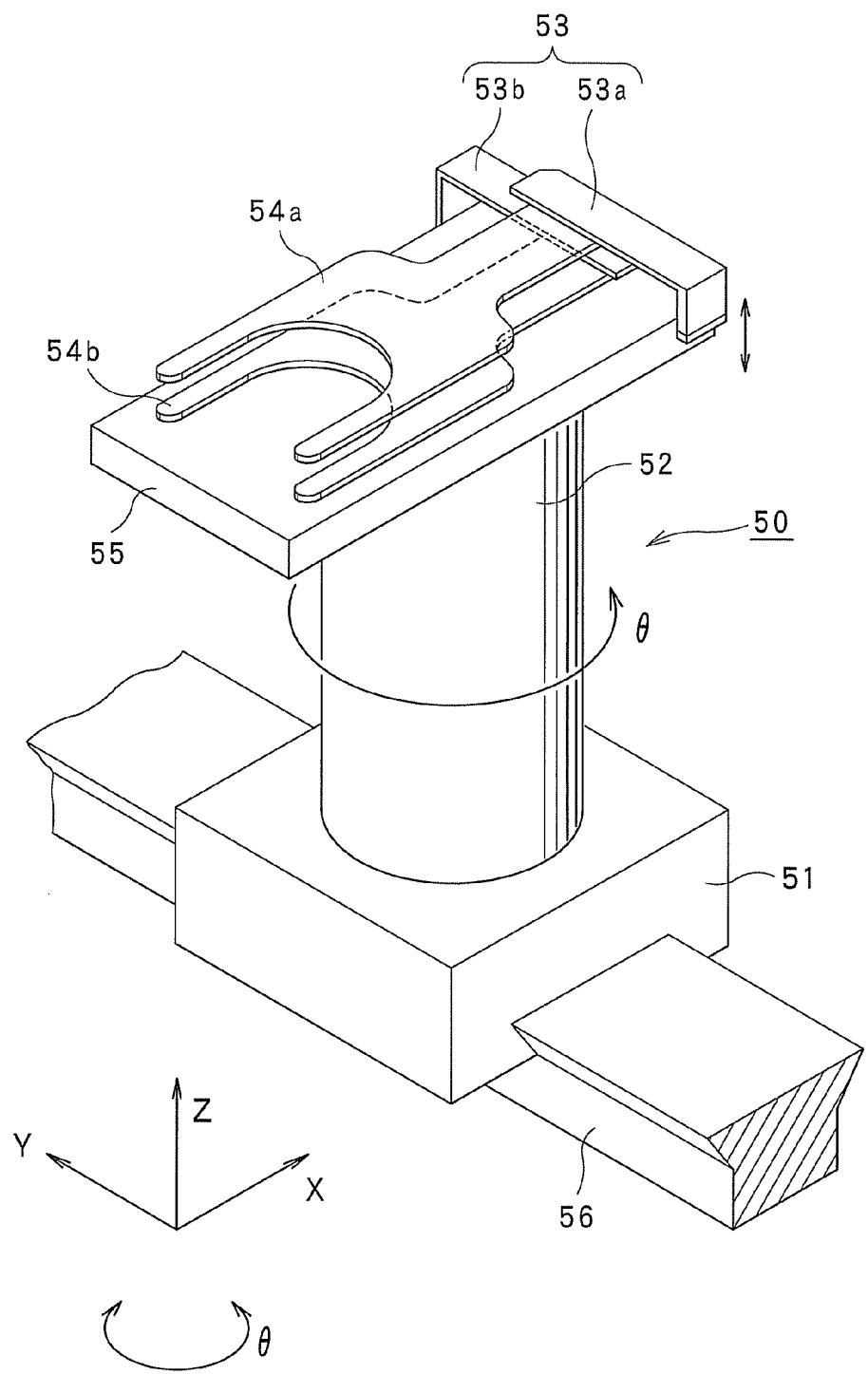
FIG. 9 is a perspective view showing a structure of a first wafer transferring apparatus in the processing system shown in FIG. 1.

Embodiments of the present disclosure will be described with reference to the drawings. FIGS. 1 to 9 are views showing a wafer processing system in this embodiment. FIG. 1 is a schematic side view showing a structure of the wafer processing system in this embodiment. FIG. 2 is a top view of the wafer processing system shown in FIG. 1 taken along the arrows A-A. FIG. 3 is a top view of the wafer processing system shown in FIG. 1 taken along the arrows B-B. FIG. 4 is a side view of the wafer processing system shown in FIG. 2 taken along the arrows C-C. FIG. 5 is a lateral sectional view showing a concrete structure of respective accommodating portions of a wafer accommodating part shown in FIG. 4. FIG. 6 is a side view of the wafer processing system shown in FIG. 2 taken along the arrows D-D. FIG. 7 is a lateral sectional view showing a structure of a FOUP accommodating wafers in the wafer processing system shown in FIG. 1. FIG. 8 is a sectional view of the FOUP shown in FIG. 7 taken along the arrows E-E. FIG. 9 is a perspective view showing a structure of a first wafer transferring apparatus in the processing system shown in FIG. 1.

As shown in FIG. 1 and so on, the wafer processing system 10 of the present disclosure comprises: a plurality of (specifically eight) wafer processing units (SPINs) 40 for performing processes such as a cleaning process and a drying process to semiconductor wafers (also referred to as "wafers W" herebelow); a wafer accommodating part 30 for temporality accommodating a plurality of wafers W such that the wafers. W are separated from each other in an up and down direction; and a FOUP (Front Opening Unified Pod, wafer storage pod) 20 capable of horizontally accommodating a plurality (e.g., twenty five) wafers W at predetermined intervals therebetween in the up and down direction. The wafer processing units 40 are divided into two groups which are disposed in the up and down direction. The upper group has the four wafer processing units 40, and the lower group has the four wafer processing units 40. More specifically, as shown in FIGS. 1 to 3 and 6 (particularly FIG. 6), in each of the groups, the plurality of wafer processing units 40 are disposed in a stacked situation along the up and down direction. That is to say, in the upper group, the two wafer processing units 40a are disposed above the other two wafer processing units 40a, respectively; in such a manner that each two wafer processing units 40a are disposed in a stacked situation. Similarly, in the lower group, the two wafer processing units 40b are disposed above the other two wafer processing units 40b, respectively; in such a manner that each two wafer processing units 40b are disposed in a stacked situation.

In addition, the wafer processing system 10 comprises a first wafer transferring apparatus 50 that is arranged between the FOUP 20 and the wafer accommodating part 30. The first wafer transferring apparatus 50 is configured to transfer wafers W, which are not yet processed by the substrate processing units 40, from the FOUP 20 to the wafer accommodating part 30, and to transfer wafers W, which have been processed by the substrate processing units 40, from the wafer accommodating part 30 to the FOUP 20. As shown in FIGS. 2, 3, and 6, the wafer processing system 10 comprises two second substrate transferring apparatuses 60a and 60b that are disposed in the up and down direction so as to correspond to the upper group and the lower group. More specifically, the upper second wafer transferring apparatus 60a is disposed so as to correspond to the upper group, and is configured to transfer wafers W between the respective wafer processing units 40a of the upper group and the wafer accommodating part 30. The lower second wafer transferring apparatus 60b is disposed so as to correspond to the lower group, and is configured to transfer wafers W between the respective wafer processing units 40b of the lower group and the wafer accommodating part 30.

In the wafer processing system 10, a wafer displacing apparatus 35 is located adjacent to the wafer accommodating part 30. The wafer displacing apparatus 35 is configured to displace a wafer W accommodated in the wafer accommodating part 30 to another position in the up and down direction in the wafer accommodating part 30. More specifically, the wafer displacing apparatus 35 is configured to displace a wafer W, which has been transferred by the first wafer transferring apparatus 50 to the wafer accommodating part 30 and is not yet processed by the wafer processing unit 40, to another position in the up and down direction in the wafer accommodating part 30, as well as displace a wafer W, which has been processed by the wafer processing unit 40 and transferred by the upper second wafer transferring apparatus 60a to the wafer accommodating part 30, to another position in the up and down direction in the wafer accommodating part 30.

Herebelow, the respective structural elements of the wafer processing system 10 are described in detail.

As shown in FIGS. 1 and 2, the wafer processing system 10 comprises a stage 25 on which the four FOUPs 20 can be placed in a line. A concrete structure of each FOUP 20 is explained with reference to FIGS. 7 and 8. As shown in FIG. 7, the FOUP 20 is configured to accommodate a plurality of, e.g., twenty five wafers W in a stacked manner, such that the wafers are separated from each other in the up and down direction. Specifically, the FOUP 20 has a hollow housing 21 that is vertically extended, and a plurality of wafer placing members 22 fixed on an inner wall of the housing 21. Wafers W can be horizontally placed on upper surfaces of the wafer placing members 22. As shown in FIG. 8, the housing 21 has a U-shape cross section, with one side surface being opened. A window opening and closing mechanism 23 formed of a shutter or the like is disposed on the opening. When the window opening and closing mechanism 23 is opened, the wafers W accommodated in the FOUP 20 can be taken out.

As shown in FIG. 7, each of the wafer placing member 22 is formed of a plate-like member horizontally fixed on the inner wall of the housing 21. As shown in FIG. 8, each wafer placing member 22 is of a U-shape having an opening 22a in a center part thereof. As shown in FIG. 8, the opening 22a of the wafer placing member 22 is smaller than the wafer W. Thus, the peripheral portion of the wafer W can be placed on the upper surface of the wafer placing member 22.

Next, the wafer accommodating part 30 and the wafer displacing apparatus 35 located adjacent to the wafer accommodating part 30 are described with reference to FIGS. 4 and 5. FIG. 4 is a side view of the wafer processing system 10 shown in FIG. 2 taken along the arrows C-C. FIG. 5 is a lateral sectional view showing concrete structures of respective accommodating portions.

As described above, the wafer accommodating part 30 is configured to temporarily accommodate a plurality of wafers W such that the wafers W are separated from each other in the up and down direction. More specifically, as shown in FIGS. 1 and 4, the wafer accommodating part 30 includes top accommodating portions 30a disposed in a plurality of (e.g., four) tiers so as to correspond to the wafer processing units 40a of the upper group, and bottom accommodating portions 30b disposed in a plurality of (e.g., eight) tiers so as to correspond to the wafer processing units 40b of the lower group. One wafer W can be horizontally accommodated in each of the four top accommodating portions 30a and each of the eight bottom accommodating portions 30b.

The concrete structures of the respective top accommodating portions 30a and the respective bottom accommodating portions 30b are explained with reference to FIG. 5. As shown in FIG. 5, the wafer accommodating part 30 includes a plurality of vertically extended column members 31. Specifically, there are provided the four column members 31, and the respective column members 31 are located on four corners of an imaginary quadrate or a rectangle along a horizontal plane. The top accommodating portions 30a and the bottom accommodating portions 30b are provided between these column members 31. In more detail, a plurality of horizontally extended partition members 32 is fixed to the respective column members 31 along the up and down direction so as to bridge the column members 31. Each of the partition members 32 is provided with three projecting members 33 of identical length which project upward from an upper surface of the partition member 32 (in FIG. 5, only two of the three projecting members 33 are illustrated). Each of the projecting members 33 can support a rear surface of a wafer W.

Since the wafer accommodating part 30 is composed of the four column members 31 located on the four corners of the imaginary quadrate or the rectangle along the horizontal plane, and the plurality of partition members 32 that are horizontally extended so as to bridge the respective column members 31, the wafer accommodating part 30 is opened at least in a right and left direction and an upper direction in FIG. 2. Thus, the first wafer transferring apparatus 50, the second wafer transferring apparatuses 60a and 60b, and the wafer displacing apparatus 35 can respectively access the wafer accommodating part 30 from different directions. Namely, the first wafer transferring apparatus 50 can access the wafer accommodating part 30 from the left direction in FIG. 2, the second wafer transferring apparatuses 60a and 60b can access the wafer accommodating part from the right direction in FIG. 2, and the wafer displacing apparatus 35 can access the wafer accommodating part 30 from the upper direction in FIG. 2. Herein, to "access the wafer accommodating part 30" means that the respective apparatuses can transfer a wafer W to the wafer accommodating part 30 and take out a wafer W from the wafer accommodating part 30.

Further, at least two of the first wafer transferring apparatus 50, the second wafer transferring apparatuses 60a and 60b, and the wafer displacing apparatus 35 can simultaneously access the wafer accommodating part 30. Thus, there can be avoided a situation in which, while a certain apparatus accesses the wafer accommodating part 30, other apparatuses cannot access the wafer accommodating part 30 and are obliged to wait. As a result, the wafer processing system 10 can increase the number of wafers W to be processed per unit time.

As shown in FIGS. 3 and 4, in the wafer accommodating part 30, wafer reversing mechanisms 34 are disposed above and below the four top accommodating portions 30a, and disposed above and below the eight bottom accommodating portions 30b. Each of the wafer reversing mechanisms 34 is configured to reverse a wafer W which has been sent to the wafer reversing mechanism 34 by the second wafer transferring apparatuses 60a and 60b.

As described above, the wafer displacing apparatus 35 is configured to displace a wafer W accommodated in the wafer accommodating part 30 to another position in the up and down direction in the wafer accommodating part 30. More specifically, the wafer displacing apparatus 35 is configured to displace a wafer W from the top accommodating portion 30a to the bottom accommodating portion 30b, and vice versa.

In more detail, as shown in FIG. 4, the wafer displacing apparatus 35 includes a vertically extended column member 36, and a fork supporting member 37 that can be elevated and lowered along the column member 36. The fork supporting member 37 supports a pair of upper and lower forks 38a and 38b each for holding a wafer W. Each of the forks 38a and 38b is configured to hold a wafer W from a rear surface thereof (from below). The upper fork 38a of the pair of forks 38a and 38b is used when a wafer W is transferred from the top accommodating portion 30a to the bottom accommodating portion 30b, and the lower fork 38b is used when a wafer W is transferred from the bottom accommodating portion 30b to the top accommodating portion 30a. When one of the pair of forks 38a and 38b enters the wafer accommodating part 30, the fork can place a wafer W in the top accommodating portion 30a or the bottom accommodating portion 30b of the wafer accommodating part 30, or can take a wafer W from the top accommodating portion 30a or the bottom accommodating portion 30b.

The upper second wafer transferring apparatus 60a, which is disposed so as to correspond to the wafer processing units 40a of the upper group, is configured to transfer a wafer W between the two, i.e., the upper and lower wafer processing units 40a of the upper group and the top accommodating portions 30a of the wafer accommodating part 30. On the other hand, the lower second wafer transferring apparatus 60b, which is disposed so as to correspond to the wafer processing units 40b of the lower group, is configured to transfer a wafer W between the two, i.e., upper and lower wafer processing units 40b of the lower group and the bottom accommodating portions 30b of the wafer accommodating part 30. The first wafer transferring apparatus 50 is configured to transfer a wafer W, which is not yet processed by the wafer processing unit 40, from the FOUP 20 to the bottom accommodating portion 30b of the wafer accommodating part 30, and is configured to transfer a wafer W, which has been processed by the wafer processing unit 40, from the bottom accommodating portion 30b of the wafer accommodating part 30 to the FOUP 20.

Next, concrete structures of the first wafer transferring apparatus 50 and the second wafer transferring apparatuses 60a and 60b are explained. At first, the structure of the first wafer transferring apparatus 50 is explained with reference to FIGS. 1 to 3 and FIG. 9.

The first wafer transferring apparatus 50 includes a base member 51 that can travel along a rail 56 extended in a Y-direction in FIG. 3, and a perpendicularly moving mechanism 52 disposed on an upper surface of the base member 51. The perpendicularly moving mechanism 52 is capable of expanding and contracting in a Z-direction. A table 55 is disposed on an upper part of the perpendicularly moving mechanism 52, and a fork supporting member 53 is fixed to the table 55. A pair of forks 54a and 54b each for holding a wafer W are supported by the fork supporting member 53.

As shown in FIG. 9, the perpendicularly moving mechanism 52 can be rotated in a θ-direction with respect to the base member 51. Namely, the table 55 is configured to be movable in the Y-direction and the Z-direction and movable in the θ-direction. The pair of forks 54a and 54b are stacked with each other above the table 55. Each of the forks 54a and 54b can hold a wafer W from a rear surface thereof (from below). The fork supporting member 53 includes horizontally moving mechanisms 53a and 53b that are respectively fixed on proximal ends of the pair of forks 54a and 54b. The horizontally moving mechanism 53a and 53b are configured to move the forks 54a and 54b in an X-direction in FIG. 9.

Each of the second wafer transferring apparatuses 60a and 60b has substantially the same structure as that of the first wafer transferring apparatus 50. More specifically, tables 65a and 65b disposed on the second wafer transferring apparatuses 63a and 63b can be respectively rotated in the θ-direction. The respective tables 65a and 65b are provided with fork supporting members 63a and 63b. The fork supporting members 63a and 63b can respectively support pairs of upper and lower forks 64a and 64b (see, FIG. 6). Each of the pair of upper and lower forks 64a and 64b can hold a wafer W from a rear surface thereof (from below). The respective pairs of upper and lower forks 64a and 64b can be moved forward and backward in the directions of the arrows in FIGS. 2 and 3 from the fork supporting members 63a and 63b. The upper fork 64a of the pair of forks 64a and the upper fork 64b of the pair of forks 64b are used when processed wafers W are transferred from the wafer processing units 40a and 40b to the wafer accommodating part 30, and the lower forks 64a and 64b are used when unprocessed wafers W are transferred from the wafer accommodating part 30 to the wafer processing units 40a and 40b.

Each of the wafer processing units 40 is of a spin type that processes wafers W one by one in a processing chamber. In the processing chamber, while a wafer W is being rotated, the wafer W is subjected to a liquid process by using a process liquid, a gas process by using a process gas, or a cleaning process and a thermal process.

Next, an operation of the wafer processing system 10 as structured above is explained.

At first, the FOUP 20 accommodating a plurality of, e.g., twenty five wafers W to be processed is placed on the stage 25. Then, the window opening and closing mechanism 23 disposed on the FOUP 20 is opened, so that the wafers W in the FOUP 20 can be taken out therefrom. Then, the first wafer transferring apparatus 50 comes close to the FOUP 20, and the pair of forks 54a and 54b of the first wafer transferring apparatus 50 respectively bring up the wafers W in the FOUP 20 and hold the same. At this time, the two wafers W adjacent to each other in the up and down direction in the FOUP 20 are simultaneously taken out by the pair of forks 54a and 54b.

Then, the two wafers W respectively held by the forks 54a and 54b of the first wafer transferring apparatus 50 are simultaneously sent to the bottom accommodating portions 30b of the wafer accommodating part 30, and are temporarily accommodated in the bottom accommodating portions 30b. More specifically, the first wafer transferring apparatus 50 firstly comes close to the wafer accommodating part 30 and the forks 54a and 54b are horizontally moved forward synchronously. Then, the table 55 is moved downward, so that the wafers W are transferred from the respective forks 54a and 54b onto the respective projecting members 33 of the bottom accommodating portions 30b of the wafer accommodating part 30. At this time, the two wafers W are accommodated in two of the four lowermost bottom accommodating portions 30b of the eight bottom accommodating portions 30b.

When the wafer W accommodated in the bottom accommodating portions 30b of the wafer accommodating part 30 is processed by the wafer processing units 40b of the lower group, the lower second wafer transferring apparatus 60b comes close to the wafer accommodating part 30. Then, the lower fork 64b of the pair of upper and lower forks 64b of the second wafer transferring apparatus 60b brings up the wafer W placed on the respective projecting members 33 of the bottom accommodating portion 30b of the wafer accommodating part 30, and holds the wafer W. Thereafter, while the fork 64b holds the wafer W, the lower second wafer transferring apparatus 60b comes close to the wafer processing unit 40b of the lower group, and the wafer W held by the fork 64b is brought into the wafer processing unit 40b. Following thereto, in the processing chamber of the wafer processing unit 40b, the wafer W is processed.

On the other hand, when the wafer W accommodated in the bottom accommodating portion 30b of the wafer accommodating part 30 is processed by the wafer processing unit 40a of the upper group, the lower fork 38b of the pair of forks 38a and 38b of the wafer displacing apparatus 35 enters the bottom accommodating portion 30b of the wafer accommodating part 30, and the fork 38b holds the wafer W in the bottom accommodating portion 30b from a rear surface of the wafer W. Then, the fork 38b is retracted from the bottom accommodating portion 30b, and the fork supporting member 37 is elevated along the column member 36. Then, the fork 38b holding the wafer W enters the top accommodating portion 30a of the wafer accommodating part 30, and the wafer W is transferred from the fork 38b onto the projecting members 33 of the top accommodating portion 30a of the wafer accommodating part 30. At this time, the wafer W is accommodated in one of the two lowermost top accommodating portions 30a of the four top accommodating portions 30a.

Thereafter, the upper second wafer transferring apparatus 60a comes close to the wafer accommodating part 30, and the lower fork 64a of the pair of upper and lower forks 64a of the second wafer transferring apparatus 60a brings up the wafer W placed on the respective projecting members 33 of the top accommodating portion 30a of the wafer accommodating part 30 and holds the wafer W. Thereafter, while the fork 64a holds the wafer W, the upper second wafer transferring apparatus 60a comes close to the wafer processing unit 40a of the upper group, and the wafer W held by the fork 64a is brought into the processing unit 40a. Following thereto, in the processing chamber of the wafer processing unit 40a, the wafer W is processed.

The wafer W, which has been processed by the wafer processing unit 40b of the lower group, is transferred by the upper fork 64b of the pair of upper and lower forks 64b of the lower second wafer transferring apparatus 60b, from the wafer processing unit 40b of the lower group to the bottom accommodating portion 30b of the wafer accommodating part 30. At this time, the wafer W is accommodated in one of the four uppermost bottom accommodating portions 30b of the eight bottom accommodating portions 30b.

On the other hand, the wafer W, which has bee processed by the wafer processing unit 40a of the upper group, is transferred by the upper fork 64a of the pair of upper and lower forks 64a of the upper second wafer transferring apparatus 60a, from the wafer processing unit 40a of the upper group to the top accommodating portion 30a of the wafer accommodating part 30. At this time, the wafer W is accommodated in one of the two uppermost top accommodating portions 30a of the four top accommodating portions 30a. Then, after the wafers W have been accommodated in both two uppermost top accommodating portions 30a, the upper fork 38a of the pair of upper and lower forks 38a and 38b of the wafer displacing apparatus 35 enters one of the two uppermost accommodating portions 30a of the wafer accommodating part 30, and the fork 38a holds the wafer W in the top accommodating portion 30a from a rear surface of the wafer W. Then, the fork 38a is retracted from the top accommodating portion 30a, and the fork supporting member 37 is lowered along the column member 36. Then, the fork 38a holding the wafer W enters the bottom accommodating portion 30b of the wafer accommodating part 30, and the wafer W is transferred from the fork 38a onto the projecting members 33 of the bottom accommodating portion 30b of the wafer accommodating part 30. At this time, the wafer W is accommodated in one of the four uppermost bottom accommodating portions 30b of the eight bottom accommodating portions 30b.

In the top accommodating portions 30a and the bottom accommodating portions 30b of the wafer accommodating part 30, a wafer that has been processed by the wafer processing unit 40 is positioned above a wafer W that is not yet processed by the wafer processing unit 40. Thus, the wafer W that has been processed by the wafer processing unit 40 can be restrained from being contaminated by the unprocessed wafer W.

After that, the wafers W in the bottom accommodating portions 30b of the wafer accommodating part 30 are taken out by the first wafer transferring apparatus 50, and are sent again into the FOUP 20. Specifically, the first wafer transferring apparatus 50 comes close to the wafer accommodating part 30, and the pair of forks 54a and 54b of the first wafer transferring apparatus 50 respectively bring up the wafers W in the bottom accommodating portions 30b of the wafer accommodating part 30 and hold the wafers W. Thereafter, the two wafers W respectively held by the forks 54a and 54b of the first wafer transferring apparatus 50 are simultaneously transferred to the FOUP 20.

In this manner, a series of processes to the wafers W in the wafer processing system 10 are completed.

As described above, according to the wafer processing system 10 in this embodiment, the second wafer transferring apparatuses 60a and 60b, which are configured to transfer wafers W between the wafer processing units 40 and the wafer accommodating part 30, are disposed in a plurality of tiers (e.g., two tiers) in the up and down direction so as to correspond to the respective groups (specifically, the upper group and the lower group) into which the plurality of wafer processing units are divided. The wafer accommodating part 30 is configured to temporarily accommodate a plurality of wafers W such that the wafers W are separated from each other in the up and down direction. The wafer displacing apparatus 35 is configured to displace a wafer W, which has been transferred by the first wafer transferring apparatus 50 to the wafer accommodating part 30 and is not yet processed by the wafer processing unit 40, to another position in the up and down direction in the wafer accommodating part 30, and a wafer W, which has been processed by the wafer processing unit 40a of the upper group and transferred by the upper second wafer transferring apparatus 60a to the wafer accommodating part 30, to another position in the up and down direction in the wafer accommodating part 30.

Thus, the wafers W can be temporarily accommodated in the plurality of positions in the up and down direction of the wafer accommodating part 30 (specifically, the top accommodating portions 30a and the bottom accommodating portions 30b). Further, the wafer W accommodated in the wafer accommodating part 30 can be displaced by the wafer displacing apparatus 35 to another position in the up and down direction. Therefore, between the respective positions in the up and down direction of the substrate accommodating part 30 in which the wafers W are accommodated (specifically, the top accommodating portions 30a and the bottom accommodating portions 30b) and the respective processing units 40a and 40b of the respective groups that are disposed in a plurality of tiers in the up and down direction, the transfer of the wafers W by one of the second wafer transferring apparatuses 60a and 60b corresponding to the wafer processing units 40a and 40b of one group can be performed independently from the other second wafer transferring apparatuses 60a and 60b.

Thus, the wafers W can be effectively transferred between the wafer accommodating part 30 and the respective wafer processing units 40a and 40b. As a result, the wafer processing system 10 can increase the number of wafers to be processed per unit time.

In the wafer processing system 10 in this embodiment, the wafer accommodating part 30 includes the top accommodating portions 30a and the bottom accommodating portions 30b. A wafer W is transferred to the bottom accommodating portion 30b by the lower second wafer transferring apparatus 60b of the upper and lower second wafer transferring apparatus 60a and 60b, and a wafer W is taken out from the bottom accommodating portion 30b by the lower second wafer transferring apparatus 60b. In addition, wafers W are transferred to the bottom accommodating portions 30b by the first wafer transferring apparatus 50, and wafers W are taken out from the bottom accommodating portions 30b by the first wafer transferring apparatus 50. On the other hand, the top accommodating portions 30a are disposed so as to correspond to the upper second wafer transferring apparatus 60a of the upper and lower second wafer transferring apparatuses 60a and 60b. A wafer W is transferred to the top accommodating portion 30a by the second wafer transferring apparatus 60a, and a wafer W is taken out from the top accommodating portion 30a by the second wafer transferring apparatus 60a. The wafer displacing apparatus 35 displaces the wafer W from the bottom accommodating portion 30b to the top accommodating portion 30a, and vice versa.

According to such a wafer processing system 10, among wafers W that have been transferred by the first wafer transferring apparatus 50 to the bottom accommodating portions 30b of the wafer accommodating part 30, the wafer W to be processed by the wafer processing unit 40b of the lower group is transferred by the corresponding lower second wafer transferring apparatus 60b, from the bottom accommodating portion 30b of the wafer accommodating part 30 to the wafer processing unit 40b of the lower group. On the other hand, the wafer W to be processed by the wafer processing unit 40a of the upper group is displaced by the wafer displacing apparatus 35 from the bottom accommodating portion 30b to the top accommodating portion 30a of the wafer accommodating part 30. Thereafter, the wafer W is transferred by the corresponding upper second wafer transferring apparatus 60a, from the top accommodating portion 30a of the wafer accommodating part 30 to the wafer processing unit 40a of the upper group. Then, the wafer W, which has been processed by the wafer processing unit 40b of the lower group, is transferred by the corresponding lower second wafer transferring apparatus 60b, from the wafer processing unit 40b of the lower group to the bottom accommodating portion 30b of the wafer accommodating part 30. On the other hand, the wafer W, which has been processed by the wafer processing unit 40a of the upper group, is transferred by the corresponding upper second wafer transferring apparatus 60a, from the wafer processing unit 40a of the upper group to the top accommodating portion 30a of the wafer accommodating part 30. Thereafter, the wafer W is displaced by the wafer displacing apparatus 35 from the top accommodating portion 30a to the bottom accommodating portion 30b of the wafer accommodating part 30. Finally, the wafer W is taken out by the first wafer transferring apparatus 50 from the bottom accommodating portion 30b of the wafer accommodating part 30.

The first wafer transferring apparatus 50 includes, along the up and down direction, the plurality of (specifically two, for example) forks 54a and 54b for holding wafers W. Thus, a plurality of (e.g., two) wafers W can be simultaneously transferred by the respective forks 54a and 54b, when the wafers W are transferred to the wafer accommodating part 30 and the wafers W are taken out from the wafer accommodating part 30. Thus, the operation of the first wafer transferring apparatus 50 for transferring the wafers W to the wafer accommodating part 30 and the operation of the first wafer transferring apparatus 50 for taking out the wafers W from the wafer accommodating part 30 can be more effectively performed. As a result, the number of wafers W to be processed per unit time can be increased.

The wafer processing system 10 in this embodiment is not limited to the above aspect, but can be variously modified. For example, the groups into which the plurality of wafer processing units 40 are divided are not limited to the upper group and the lower group as shown in FIG. 6 and so on. The wafer processing units 40 may be divided into three or more groups in the up and down direction. In this case, the second wafer transferring apparatuses are disposed in a plurality of tiers (three or more tiers) in the up and down direction so as to correspond to the respective groups disposed in three or more tiers in the up and down direction. In addition, in this case, instead of the wafer accommodating part 30 including the top accommodating portions 30a and the bottom accommodating portions 30b as shown in FIG. 1, the wafer accommodating part 30 includes three or more accommodating portions so as to correspond to the respective groups disposed in three or more tiers in the up and down direction. Wafers W are transferred by the corresponding wafer transferring apparatus between the respective accommodating portions and the wafer processing units of the respective groups.

Figure 10:
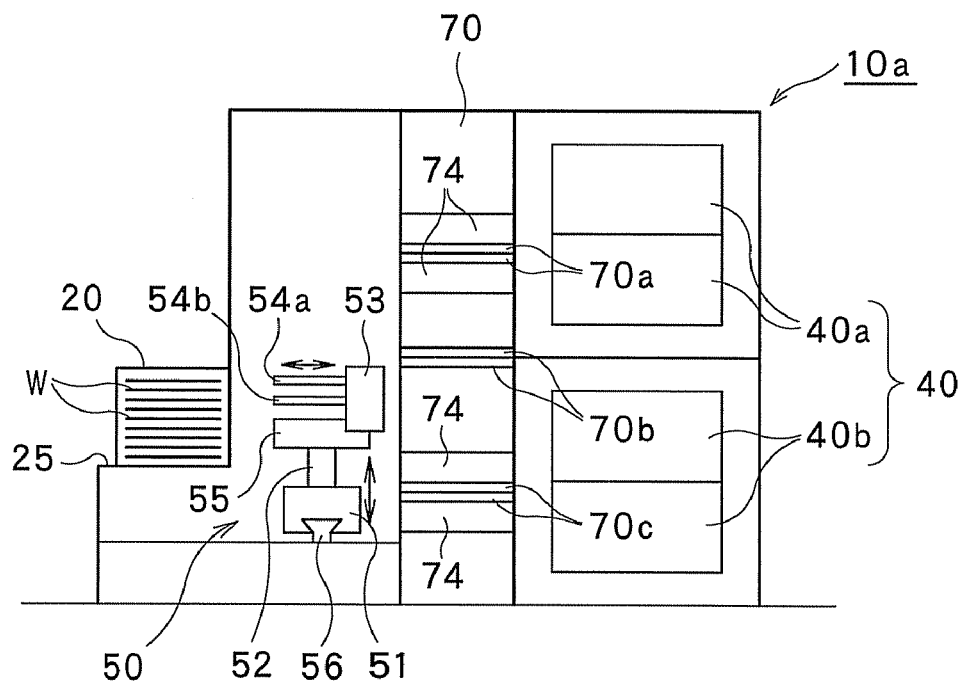
FIG. 10 is a schematic lateral sectional view showing another structure of the wafer processing system in one embodiment of the present disclosure.

Herebelow, another aspect of the wafer accommodating part is explained with reference to FIG. 10. FIG. 10 is a schematic lateral sectional view showing another structure of the wafer processing system in one embodiment of the present disclosure. In the wafer processing system 10a shown in FIG. 10, structural elements substantially the same structural elements of the wafer processing system 10 shown in FIGS. 1 to 9 are shown by the same reference numbers, and description thereof is omitted.

The wafer processing system 10a shown in FIG. 10 is equipped with a wafer accommodating part 70, which is described in detail below, in place of the wafer accommodating part 30 shown in FIGS. 1 to 9. Similarly to the wafer accommodating part 30 shown in FIG. 1, the wafer accommodating part 70 is configured to temporarily accommodate a plurality of wafers W such that the wafers W are separated from each other in the up and down direction. The wafer accommodating part 70 includes top accommodating portions 70a disposed in a plurality of tiers (e.g., two tiers) so as to correspond to the wafer processing units 40a of the upper group, bottom accommodating portions 70c disposed in a plurality of tiers (e.g., two tiers) so as to correspond to the wafer processing units 40b of the lower group, and intermediate accommodating portions 70b disposed in a plurality of tiers (e.g., two tiers) between the top accommodating portions 70a and the bottom accommodating portions 70c. One wafer W can be horizontally accommodated in each of the two top accommodating portions 70a, the two intermediate accommodating portions 70b, and the two bottom accommodating portions 70c, respectively.

As shown in FIG. 10, in the wafer accommodating part 70, wafer reversing mechanisms 74 are disposed above and below the two top accommodating portions 70a, and disposed above and below the two bottom accommodating portions 70b. Each of the wafer reversing mechanisms 74 is configured to reverse a wafer W which has been sent to the wafer reversing mechanism 74 by second wafer transferring apparatuses 60a and 60b.

In the wafer processing system 10a shown in FIG. 10, similarly to the wafer processing system 10 shown in FIGS. 1 to 9, the wafer displacing apparatus 35 is configured to displace a wafer W accommodated in the wafer accommodating part 70 to another position in the up and down direction in the wafer accommodating part 70. More specifically, the wafer displacing apparatus 35 is configured to displace a wafer W among the top accommodating portion 70a, the intermediate accommodating portion 70b, and the bottom accommodating portion 70c.

The upper second wafer transferring apparatus 60a, which is disposed so as to correspond to the wafer processing units 40a of the upper group, is configured to transfer a wafer W between the wafer processing unit 40*a* of the upper group and the top accommodating portion 70*a* of the wafer accommodating part 70. Further, the lower second wafer transferring apparatus 60*b*, which is disposed so as to correspond to the wafer processing units 40*b* of the lower group, is configured to transfer a wafer W between the wafer processing unit 40*b* and the bottom accommodating portion 70*c* of the wafer accommodating part 70. Furthermore, the first wafer transferring apparatus 50 is configured to transfer wafers W, which are not yet processed by the wafer processing units 40, from the FOUP 20 to the intermediate accommodating portions 70*b* of the wafer accommodating part 70, and is configured to transfer wafers W, which have been processed by the wafer processing units 40, from the intermediate accommodating portions 70*b* of the wafer accommodating part 70 to the FOUP 20.

Next, an operation of the wafer processing system 10*a* as structured above shown in FIG. 10 is explained. In the explanation of the operation of the wafer processing system 10*a* shown in FIG. 10, explanation of an operation that is same as that of the wafer processing system shown in FIGS. 1 to 9 is omitted.

At first, wafers W are transferred by the first wafer transferring apparatus 50 from the FOUP 20 to the intermediate accommodating portion 70*b* of the wafer accommodating part 70. At this time, the wafers W are accommodated in the lower intermediate accommodating portion 70*b* of the upper and lower intermediate accommodating portions 70*b*.

When the wafer W accommodated in the intermediate accommodating portion 70*b* of the wafer accommodating part 70 is processed by the wafer processing unit 40*b* of the lower group, the wafer W is displaced by the lower fork 38*b* of the pair of upper and lower forks 38*a* and 38*b* of the wafer displacing apparatus 35, from the intermediate accommodating portion 70*b* to the bottom accommodating portion 70*c*. At this time, the wafer W is accommodated in the lower bottom accommodating portion 70*c* of the upper and lower bottom accommodating portions 70*c*. Thereafter the lower second wafer transferring apparatus 60*b* comes close to the wafer accommodating part 70, and the wafer W is transferred by the lower fork 64*b* of the pair of upper and lower forks 64*b* of the second wafer transferring apparatus 60, from the bottom accommodating portion 70*c* of the wafer accommodating part 70 to the wafer processing unit 40*b* of the lower group. Then, in the processing chamber of the wafer processing unit 40*b*, the wafer W is processed.

On the other hand, when the wafer W accommodated in the intermediate accommodating portion 70*b* of the wafer accommodating part 70 is processed by the wafer processing unit 40*a* of the upper group, the wafer W is displaced by the lower fork 38*b* of the pair of upper and lower fork 38*a* and 38*b* of the wafer displacing apparatus 35, from the intermediate portion 70*b* to the top accommodating portion 70*a*. At this time, the wafer W is accommodated in the lower top accommodating portion 70*a* of the upper and lower top accommodating portions 70*a*. Thereafter, the upper second wafer transferring apparatus 60*a* comes close to the wafer accommodating part 70, and the wafer W is transferred by the lower fork 64*a* of the pair of upper and lower forks 64*a* of the second wafer transferring apparatus 60*a*, from the top accommodating portion 70*a* of the wafer accommodating part 70 to the wafer processing unit 40*a* of the upper group. Then, in the processing chamber of the wafer processing unit 40*a*, the wafer W is processed.

The wafer W, which has been processed by the wafer processing unit 40*b* of the lower group, is transferred by the upper fork 64*b* of the pair of upper and lower forks 64*b* of the lower second wafer transferring apparatus 60*b*, from the wafer processing unit 40*b* of the lower group to the bottom accommodating portion 70*c* of the wafer accommodating part 70. At this time, the wafer W is accommodated in the upper bottom accommodating portion 70*c* of the upper and lower bottom accommodating portions 70*c*. Thereafter, the wafer W is displaced by the upper fork 38*a* of the pair of upper and lower forks 38*a* and 38*b* of the wafer displacing apparatus 35, from the bottom accommodating portion 70*c* to the intermediate portion 70*b*. At this time, the wafer W is accommodated in the upper intermediate accommodating portion 70*b* of the upper and lower intermediate accommodating portions 70*b*.

On the other hand, the wafer W, which has been processed by the wafer processing unit 40*a* of the upper group, is transferred by the upper fork 64*a* of the pair of upper and lower forks 64*a* of the upper second wafer transferring apparatus 60*a*, from the wafer processing unit 40*a* of the upper group to the top accommodating portion 70*a* of the wafer accommodating part 70. At this time, the wafer W is accommodated in the upper top accommodating portion 70*a* of the upper and lower top accommodating portions 70*a*. Thereafter, the wafer W is displaced by the upper fork 38*a* of the pair of upper and lower forks 38*a* and 38*b* of the wafer displacing apparatus 35, from the top accommodating portion 70*a* to the intermediate accommodating portion 70*b*. At this time, the wafer W is accommodated in the upper intermediate accommodating portion 70*b* of the upper and lower intermediate accommodating portions 70*b*.

In the top accommodating portions 70*a*, the intermediate accommodating portions 70*b*, and the bottom accommodating portions 70*c* of the wafer accommodating part 70, the wafer W that has been processed by the wafer processing unit 40 is positioned above the wafer W that is not yet processed by the wafer processing unit 40. Thus, the wafer W that has been processed by the wafer processing unit 40 can be restrained from being contaminated by the unprocessed wafer W.

Thereafter, the wafers W in the intermediate accommodating portion 70*b* of the wafer accommodating part 70 are taken out by the first wafer transferring apparatus 50, and are sent again into the FOUP 20.

In this manner, a series of processes to the wafers W in the wafer processing system 10 are completed.

As described above, in the wafer processing system 10*a* having the structure shown in FIG. 10, the wafer accommodating part 70 includes the top accommodating portions 70*a*, the intermediate accommodating portions 70*b*, and the bottom accommodating portions 70*c*. Wafers W are transferred to the intermediate accommodating portions 70*b* by the first wafer transferring apparatus 50, and wafers W are taken out from the intermediate accommodating portions 70*b* by the first wafer transferring apparatus 50. The top accommodating portions 70*a* and the bottom accommodating portions 70*c* are disposed so as to correspond to the respective upper and lower second wafer transferring apparatuses 60*a* and 60*b*. The wafers W are transferred by the corresponding respective second wafer transferring apparatuses 60*a* and 60*b*, and are taken out by the corresponding respective second wafer transferring apparatuses 60*a* and 60*b*. The wafer displacing apparatus 35 is configured to displace the wafer W among the top accommodating portions 70*a*, the intermediate accommodating portions 70*b*, and the bottom accommodating portions 70*c*. In the wafer accommodating part 70, the intermediate accommodating portions 70*b* is located between the top accommodating portions 70*a* and the bottom accommodating portions 70*c*.

Also in the wafer processing system 10a shown in FIG. 10, similarly to the wafer processing system 10 shown in FIGS. 1 to 9, wafers W can be temporarily accommodated in the plurality of positions in the up and down direction of the wafer accommodating part 70 (specifically, the top accommodating portions 70a, the intermediate accommodating portions 70b, and the bottom accommodating portions 70c). A wafer W accommodated in the wafer accommodating part 70 can be displaced by the wafer displacing apparatus 35 to another position in the up and down direction. Therefore, between the respective positions in the up and down direction in which the wafers W are accommodated in the wafer accommodating part 70 (specifically, the top accommodating portions 70a and the bottom accommodating portions 70c) and the respective processing units 40a and 40b of the respective groups that are disposed in a plurality of tiers in the up and down direction, the transfer of the wafers W by one of the second wafer transferring apparatuses 60a and 60b corresponding to the wafer processing units 40a and 40b of one group can be performed independently from the other of the second wafer transferring apparatuses 60a and 60b. Further, independently from access by the second wafer transferring apparatuses 60a and 60b to the wafer accommodating part 70, the first wafer transferring apparatus 50 can access the intermediate accommodating portions 70b of the wafer accommodating part 70.

Thus, wafers W can be effectively transferred between the wafer accommodating part 70 and the respective wafer processing units 40a and 40b, and the first wafer transferring apparatus 50 can smoothly access the wafer accommodating part 70. As a result, the wafer processing system 10a can increase the number of wafers to be processed per unit time.

The invention claimed is:

1. A substrate processing system comprising:
a plurality of substrate processing units each of which is configured to process a substrate, the substrate processing units being divided into a plurality of groups that are disposed along an up and down direction;
a substrate accommodating part configured to temporarily accommodate a plurality of substrates such that the substrates are separated from each other in the up and down direction;
a first substrate transferring apparatus configured to transfer a substrate that is not yet processed by the substrate processing unit, to the substrate accommodating part, and to take out a substrate that has been processed by the substrate processing unit, from the substrate accommodating part;
a plurality of second substrate transferring apparatuses disposed in tiers in the up and down direction so as to correspond to the respective groups in the up and down direction, each of the second substrate transferring apparatuses being configured to transfer a substrate between the substrate processing unit of the corresponding group and the substrate accommodating part; and
a substrate displacing apparatus configured to displace a substrate, which has been transferred by the first substrate transferring apparatus to the substrate accommodating part and is not yet processed by the substrate processing unit, to another position in the up and down direction in the substrate accommodating part, as well as displace a substrate, which has been processed by the substrate processing unit and transferred by the second substrate transferring apparatus to the substrate accommodating part, to another position in the up and down direction in the substrate accommodating part.

2. The substrate processing system according to claim 1, wherein
the substrate accommodating part includes:
a first accommodating portion, a substrate being transferred to the first accommodating portion by the first substrate transferring apparatus, and a substrate being taken out from the first accommodating portion by the first substrate transferring apparatus; and
a plurality of second accommodating portions disposed so as to correspond to the respective second substrate transferring apparatuses, a substrate being transferred to the second accommodating portion by the corresponding second substrate transferring apparatus, and a substrate being taken out from the second accommodating portion by the corresponding second substrate transferring apparatus; and
the substrate displacing apparatus is configured to displace a substrate between the first accommodating portion and the second accommodating portions.

3. The substrate processing system according to claim 2, wherein
in the substrate accommodating part, the first accommodating portion is arranged between the two second accommodating portions of the plurality of second accommodating portions.

4. The substrate processing system according to claim 1, wherein
the substrate accommodating part includes:
a first accommodating portion, a substrate being transferred to the first accommodating portion by the one second substrate transferring apparatus of the plurality of second substrate transferring apparatuses, and a substrate being taken out from the first accommodating portion by the one second substrate transferring apparatus, while a substrate is transferred to the first accommodating portion by the first substrate transferring apparatus and a substrate is taken out from the first accommodating portion by the first substrate transferring apparatus; and
one or more second accommodating portions disposed so as to correspond to the second substrate transferring apparatus(es) other than the one second transferring apparatus of the plurality of second substrate transferring apparatuses, a substrate being transferred to the second accommodating portion by the corresponding second substrate transferring apparatus, and a substrate being taken out from the second accommodating portion by the corresponding second substrate transferring apparatus; and
the substrate displacing apparatus is configured to displace a substrate between the first accommodating portion and the second accommodating portion(s).

5. The substrate processing system according to claim 1, wherein:
the first substrate transferring apparatus includes, along the up and down direction, a plurality of forks each for holding a substrate; and
a plurality of substrates are simultaneously transferred by the respective forks, when the substrates are transferred to the substrate accommodating part and when the substrates are taken out from the substrate accommodating part.

6. The substrate processing system according to claim 1, wherein
in each of the groups, the plurality of substrate processing units are disposed in a stacked situation along the up and down direction.

7. The substrate processing system according to claim 1, wherein
   the first substrate transferring apparatus, the second transferring apparatuses, and the substrate displacing apparatus are configured to respectively access the substrate accommodating part from different directions.

8. The substrate processing system according to claim 1, wherein
   at least two of the first substrate transferring apparatus, the second transferring apparatuses, and the substrate displacing apparatus are configured to simultaneously access the substrate accommodating part.

9. The substrate processing system according to claim 1, wherein
   the first substrate transferring apparatus, the second transferring apparatuses, and the substrate displacing apparatus are configured to respectively access the substrate accommodating part from different directions, and wherein
   at least two of the first substrate transferring apparatus, the second transferring apparatuses, and the substrate displacing apparatus are configured to simultaneously access the substrate accommodating part.

* * * * *